US011656589B2

(12) United States Patent
Zhang et al.

(10) Patent No.: US 11,656,589 B2
(45) Date of Patent: May 23, 2023

(54) SYSTEMS AND METHODS FOR AUTOMATIC POWER TOPOLOGY DISCOVERY

(71) Applicant: Rockwell Automation Technologies Inc., Mayfield Heights, OH (US)

(72) Inventors: Xiaolong Zhang, Shanghai (CN); Benfeng Tang, Shanghai (CN); Linglai Li, Shanghai (CN); David B. Berman, Franklin, WI (US); Phillip R. Bush, New Berlin, WI (US); Steven T. Haensgen, New Berlin, WI (US); Michael L. Gasperi, Racine, WI (US); Sean C. Schmelzer, Colgate, WI (US); Alex Nicoll, Brookfield, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 259 days.

(21) Appl. No.: 17/016,049

(22) Filed: Sep. 9, 2020

(65) Prior Publication Data
US 2022/0075337 A1    Mar. 10, 2022

(51) Int. Cl.
*G06N 7/00* (2023.01)
*G01R 19/25* (2006.01)
(Continued)

(52) U.S. Cl.
CPC ....... *G05B 19/042* (2013.01); *G01R 19/2513* (2013.01); *G06N 7/005* (2013.01);
(Continued)

(58) Field of Classification Search
CPC .......... G05B 19/042; G05B 2219/2639; G01R 19/2513; G06N 7/005; H02J 13/00002;
(Continued)

(56) References Cited

U.S. PATENT DOCUMENTS 9,568,514 B2    2/2017 Li et al.
2006/0020729 A1*  1/2006 Nakamura ........ H04L 12/40058
                                                  711/100
(Continued)

FOREIGN PATENT DOCUMENTS

WO    2012031613 A1    3/2012

OTHER PUBLICATIONS

European Search Report issued by the European Patent Office dated Feb. 4, 2022 for EP Patent Application No. 21191635.8-1202, 7 pages.

*Primary Examiner* — Roy Y Yi
*Assistant Examiner* — Geoffrey T Evans

(57) ABSTRACT

Various embodiments of the present technology generally relate to power topology discovery in industrial environments. More specifically, some embodiments relate to automatic power topology discovery for factories based on device data that is already recorded for other purposes. Systems and methods described herein may be used to generate an accurate electrical network topology by collecting power data from power devices that may provide real-time or recorded measurements, detecting power change events, and matching power change signatures over power events for the devices in order to calculate the likelihoods of possible topology assumptions. Power change event data is used to recursively update topology probabilities using the Bayesian formula until a system topology can be produced with satisfactory confidence.

20 Claims, 17 Drawing Sheets

(51) Int. Cl.
    *G05B 19/042*     (2006.01)
    *H02J 13/00*     (2006.01)

(52) U.S. Cl.
    CPC .... *H02J 13/00002* (2020.01); *G01D 2204/47* (2021.05); *G05B 2219/2639* (2013.01)

(58) Field of Classification Search
    CPC .... H02J 2203/20; H02J 3/00; G01D 2204/47; Y02B 90/20; Y02E 60/00; Y04S 20/00; Y04S 40/20
    See application file for complete search history.

(56) References Cited

U.S. PATENT DOCUMENTS

| | | |
|---|---|---|
| 2013/0035885 A1 | 2/2013 | Sharon et al. |
| 2015/0153153 A1 | 6/2015 | Premm et al. |
| 2019/0075027 A1 | 3/2019 | Beyer et al. |

\* cited by examiner

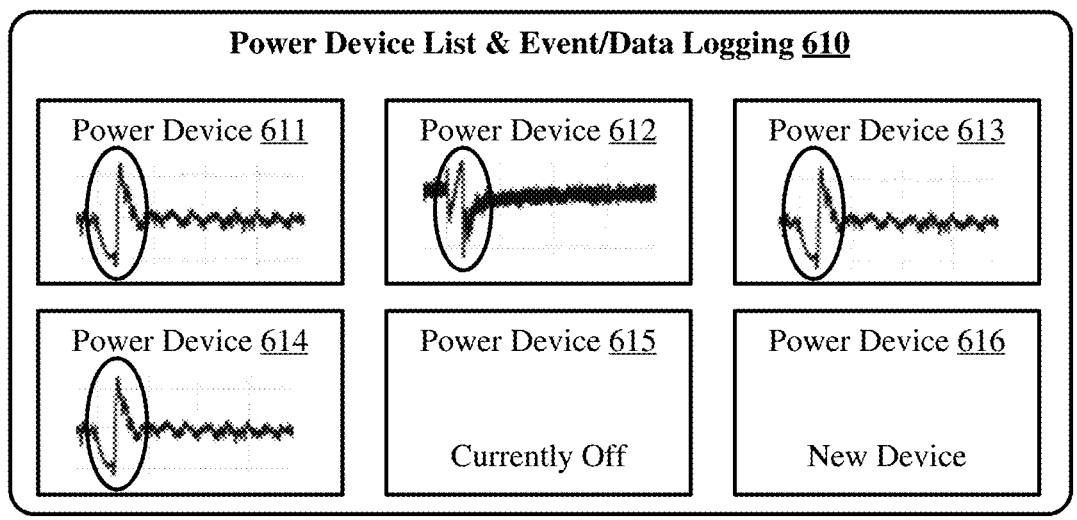
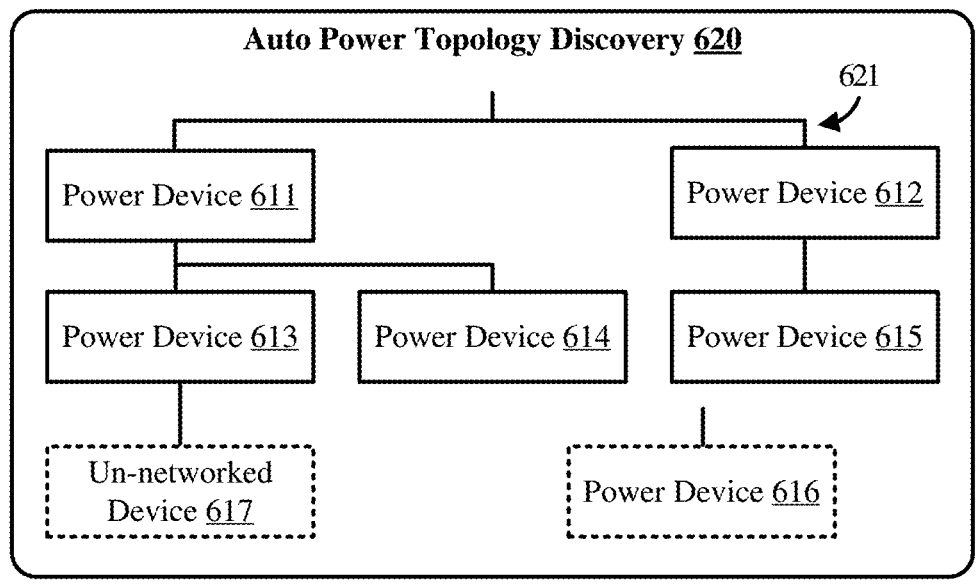
FIGURE 6

1020

| Connector-Connector Relations | | | |
|---|---|---|---|
| | DownstreamProb | UpstreamProb | NoRelationProb |
| ('PM1', 'PM2') | 0.333 | 0.333 | 0.333 |
| ('PM1', 'PM3') | 0.333 | 0.333 | 0.333 |
| ('PM2', 'PM3') | 0.333 | 0.333 | 0.333 |

FIGURE 10B

Load-Connector Relations

| | DownstreamProb | NoRelationProb |
|---|---|---|
| ('PM4', 'PM1') | 0.5 | 0.5 |
| ('PM4', 'PM2') | 0.5 | 0.5 |
| ('PM4', 'PM3') | 0.5 | 0.5 |
| ('PM5', 'PM1') | 0.5 | 0.5 |
| ('PM5', 'PM2') | 0.5 | 0.5 |
| ('PM5', 'PM3') | 0.5 | 0.5 |
| ('PM6', 'PM1') | 0.5 | 0.5 |
| ('PM6', 'PM2') | 0.5 | 0.5 |
| ('PM6', 'PM3') | 0.5 | 0.5 |
| ('PM7', 'PM1') | 0.5 | 0.5 |
| ('PM7', 'PM2') | 0.5 | 0.5 |
| ('PM7', 'PM3') | 0.5 | 0.5 |
| ('E300_2', 'PM1') | 0.5 | 0.5 |
| ('E300_2', 'PM2') | 0.5 | 0.5 |
| ('E300_2', 'PM3') | 0.5 | 0.5 |
| ('E300_1', 'PM1') | 0.5 | 0.5 |
| ('E300_1', 'PM2') | 0.5 | 0.5 |
| ('E300_1', 'PM3') | 0.5 | 0.5 |

SYSTEMS AND METHODS FOR AUTOMATIC POWER TOPOLOGY DISCOVERY

BACKGROUND

It is common for control systems to have known hierarchical configurations for all of the control elements in a system. However, power hierarchies are often unknown, and establishing a relation between the two can be very useful. Accurate electrical network topology is an important infrastructure for power management. Many industrial environments and factory settings do not have a complete inventory of installed equipment and most do not have accurate one-line diagrams—especially in cases where a factory has a legacy system that has undergone many changes in history. It can be very difficult and time consuming to re-draw and maintain diagrams and power topologies manually. However, knowledge of a system's power topology is essential for a variety of purposes including locating power disturbance events, cause inference of disturbance events, arc flash mapping, and similar.

Power topology identification has two common types: topology change detection and blind topology identification. The first, topology change detection, is commonly used in practice because the status of some devices such as circuit breakers may be unknown, but their open/closed status affects the power topology. Alternatively, it is more difficult to reconstruct the entire power topology directly from measurements using the second analysis type, blind topology identification. Extended state estimation and measurement correlation analysis are main techniques applied to power topology identification, where measurement accuracy and synchronization are key factors. However, these methods focus mainly on the power distribution side (i.e., bus and transmission lines) and do not have the ability to look into lower levels of load branches. Thus, a new technique for power network topology identification is disclosed.

It is with respect to this general technical environment that aspects of the present technology disclosed herein have been contemplated. Furthermore, although a general environment has been discussed, it should be understood that the examples described herein should not be limited to the general environment identified in the background.

Overview

This Overview is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Various embodiments of the present technology generally relate to systems and methods for automatic electrical network topology discovery in factory environments. In an embodiment of the present technology, a method of identifying power network topology comprises collecting power data from a plurality of devices within a power network, detecting a power change event in at least a first power device of the plurality of devices and a second power device of the plurality of devices, and updating a probability that the first power device is connected to the second power device based on the detected power change event.

In some embodiments, the method further comprises updating a network topology assumption based on the updated probability that the first power device is connected to the second power device. The method may further comprise generating a network topology diagram comprising the plurality of devices based on the updated network topology assumption. In some embodiments, updating the probability that the first power device is connected to the second power device comprises updating a probability that the first power device is downstream of the second power device in the power network. Furthermore, updating the probability that the first power device is connected to the second power device may comprise updating an adjacency matrix, wherein the adjacency matrix maps probabilities of relationships between the plurality of devices, and the method may further comprises generating a topological graph depicting upstream and downstream relationships between the plurality of devices based on the adjacency matrix. In some examples, the plurality of devices may comprise one or more of a power meter, a circuit breaker, a contactor, an overload relay, and a drive.

In an alternative embodiment, one or more computer-readable storage media have program instructions stored thereon to identify power network topology in a factory. The program instructions, when read and executed by a processing system, direct the processing system to at least collect power data from a plurality of devices within a power network, detect a power change event in at least a first power device of the plurality of devices and a second power device of the plurality of devices, and update a probability that the first power device is connected to the second power device based on the detected power change event.

In yet another embodiment, a system comprises one or more computer-readable storage media, a processing system operatively coupled with the one or more computer-readable storage media, and program instructions stored on the one or more computer-readable storage media for identifying power network topology. The program instructions, when read and executed by the processing system, direct the processing system to at least collect power data from a plurality of devices within a power network, detect a power change event in at least a first power device of the plurality of devices and a second power device of the plurality of devices, and update a probability that the first power device is connected to the second power device based on the detected power change event.

BRIEF DESCRIPTION OF THE DRAWINGS

Many aspects of the disclosure can be better understood with reference to the following drawings. The components in the drawings are not necessarily drawn to scale. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

FIG. 6 illustrates power topology discovery process in accordance with some embodiments of the present technology;

FIGS. 10A-10F illustrate series of steps for detecting power change events and updating topology assumptions in accordance with some embodiments of the present technology;

Figure 1:
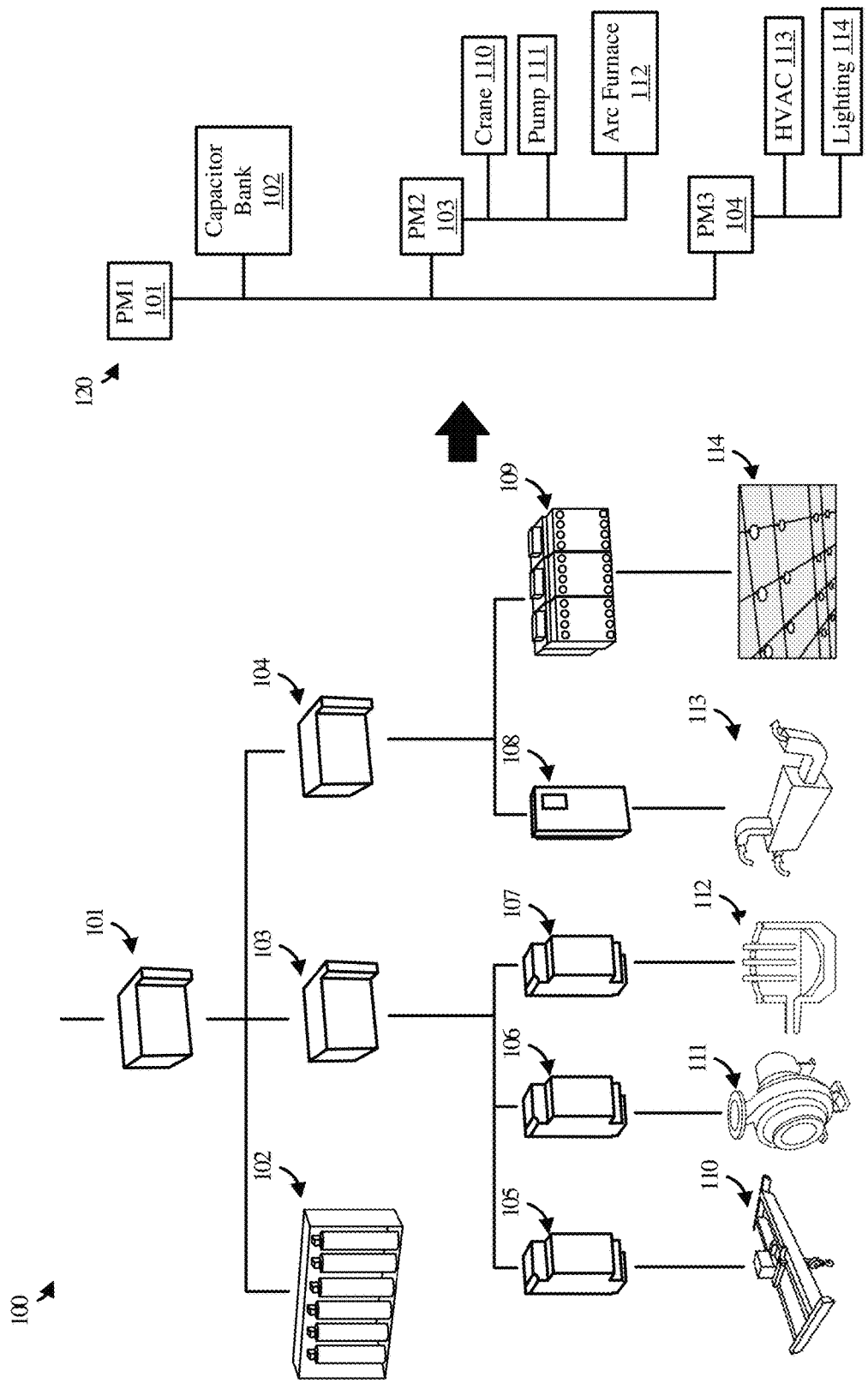
FIG. 1 illustrates an example of a power network and corresponding topology diagram that can be generated in accordance with some embodiments of the present technology.

The drawings have not necessarily been drawn to scale. Similarly, some components or operations may not be separated into different blocks or combined into a single block for the purposes of discussion of some of the embodiments of the present technology. Moreover, while the technology is amendable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

The following description and associated figures teach the best mode of the invention. For the purpose of teaching inventive principles, some conventional aspects of the best mode may be simplified or omitted. The following claims specify the scope of the invention. Note that some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by the claims and their equivalents.

Various embodiments of the present technology generally relate to the automated capture of electrical power network topology in industrial environments. More specifically some embodiments relate to detecting the topology of electrical power devices in a factory based on device signatures over power change events and updating probabilities of topology relations using the Bayesian method. An accurate electrical connection diagram is an important infrastructure for power management—it can be essential for locating power disturbance events, causes of power disturbance events, arc flash mapping, and many other applications. However, an accurate electrical network topology is often not available for many industrial systems because they are difficult and time consuming to produce, re-draw, and maintain manually. Thus, accurate one-line diagrams do not exist for many industrial power and controls systems, especially in cases where the electrical network includes a legacy system that has undergone many changes since its original setup.

Thus, the present technology provides a means for synthesizing power data and control data to provide a better understanding and analysis of power and control systems. Many power devices collect and record data in real time for a variety of purposes. The technology described herein may only need to access and use the data that is already being recorded by various devices. Automatically mapping an electrical power network with underlying load information based on the power and control data can aid in determining the location of disturbance events, providing visualization of plant status, identifying preventative maintenance recommendations, providing a basis for arc flash mapping, and additional uses. An electrical topology map can help prevent production line downtime and identify changes in arc flash potential to maintain plant safety.

Control system configurations and their hierarchical configurations are often known for all control elements, but the control hierarchy differs from the power hierarchy, and knowing the relationship between the control and power hierarchies can be beneficial to a plant. First, it is helpful to determine how the configuration of control system elements can be used for mapping. For example, motor control and protection devices such as drives, soft starters, and overload relays can provide some power information (usually current values) that may be useful for synthesis with power monitor data. Then, the gaps in the control system information that are needed to complete the mapping from control hierarchy to power hierarchy can be identified.

Power topology identification is an important topic in power system analysis. Power system analysis has two types: topology change detection and blind topology identification. Topology change detection is common in practice since the status of some circuit breakers may not be known, and the status of the circuit breakers (i.e., open/closed) changes the power topology. It is more difficult to reconstruct the entire power topology directly from measurements using blind topology identification. Extended state estimation and measurement correlation analysis are the main techniques applied for power topology identification, where measurement accuracy and synchronization are key factors. These studies focus mainly on power distribution (i.e., bus and transmission lines), while the present technology can observe lower levels into load branches.

Power devices can provide real-time measurements such as voltage (V), current (I), power (P), charge (Q), state, and power quality, as well as static information such as rated power and load type. Thus, the method disclosed herein matches device signatures over power change events to update probabilities of network topology possibilities. A power change event can be any load change or fault in the power system related to the power topology structure. An event may be detected from a device state change, or by analyzing power measurement data via known algorithms. Device signatures over a power event are then matched to calculate the likelihood of possible topology assumptions, which are used to update the topology probabilities via the Bayesian method. Both real-time signatures and signatures from static information may be used in some implementations. Topology probabilities are recursively updated over power change events until the system topology can be drawn with a satisfactory confidence.

The technology described herein may be used to describe any or all power topology problems in a uniform probabilistic framework from which the information (e.g., offline, online, semantics, data, etc.) can be used in the same manner, wherein the uniform probabilistic framework includes calculating the likelihood of an observation which is used to calculate the posterior probability from a prior probability. In this manner, existing topology identification techniques may be included as sub-problems under the present framework. The present technology is not only able to identify the topology of "smart" power devices, such as power monitors, drives, and the like (i.e., those with network communication and power measurement capabilities), but also makes it possible to identify the topology of other devices such as contactors, stand-alone motors, and the like (i.e., those with limited status and measurements and those without network communication capability). The technology described herein is inherently robust because it converges to correct power topology results over time and is therefore not impacted or is minimally impacted by bad event records and data (assuming there are more good quality event records and data than bad). The dynamic power topological graph based on device connection probabilities provides a straight-forward, hierarchical visualization of power devices in a factory. Furthermore, the continuous monitoring of power signatures is helpful for power system diagnostics; a new event may be used not only to update previous probabilities, but also to verify whether they match previously identified topologies to detect any potential faults or abnormal conditions in a power system.

FIG. 1 illustrates an example scenario including power system 100 and power topology schematic 120. Power topology schematic 120 is generated based on power system 100 using power topology discovery methods in accordance with the technology described herein. Power system 100 represents the real power topology including various power components, wherein the power line connections of the components is not accurately known. Power topology schematic 120 represents an accurate connection diagram generated from power system 100 in accordance with embodiments of the present technology. Power system 100 includes power monitor 101, capacitor bank 102, power monitor 103, power monitor 104, controller 105, controller 106, controller, 107, controller 108, controller 109, crane 110, pump 111, arc furnace 112, HVAC 113, and lighting 114. Capacitor bank 102, power monitor 103, and power monitor 104 are directly downstream from power monitor 101. Controller 105, controller 106, and controller 107 are directly downstream from power monitor 103. Controller 108 and controller 109 are directly downstream from power monitor 104. Crane 110, pump 111, and arc furnace 112 are directly downstream from controller 105, controller 106, and controller 107, respectively. HVAC 113 and lighting 114 are directly downstream from controller 108 and controller 109, respectively.

Power topology schematic includes power monitor 101, capacitor bank 102, power monitor 103, power monitor 104, crane 110, pump 111, arc furnace 112, HVAC 113, and lighting 114. Power topology schematic 120 includes an accurate topology depiction of power system 100. Capacitor bank 102, power monitor 103, and power monitor 104 are depicted as downstream from power monitor 101 in power topology schematic 120. Crane 110, pump 111, and arc furnace 112 are depicted as downstream from power monitor 103. HVAC 113 and lighting 114 are depicted as downstream from power monitor 104.

In a factory control system, components are connected by communication networks, and the network configurations can be known from controller or configuration tools. However, the power network topology may be completely different from the control network topology, since the latter is mainly organized by functions. A control system is organized by communication network connections and functionality, centered by controllers, wherein a power monitor is connected under one network adapter. Alternatively, a power system is organized by the power connections, wherein power monitors are often located in entry bus points to monitor system power consumptions, and devices belonging to different sub-networks may be under the same power bus. Thus, a main objective of the present technology is to identify where the loads are connected, while the loads vary in information availability.

Figure 2B:
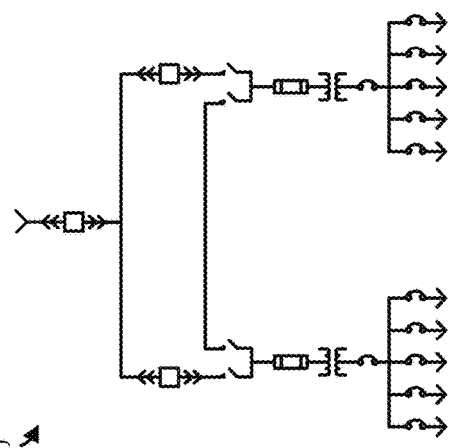
FIGS. 2A-2D illustrate several examples of common power topologies that may be exist in a factory in accordance with some embodiments of the present technology.
Figure 2D:
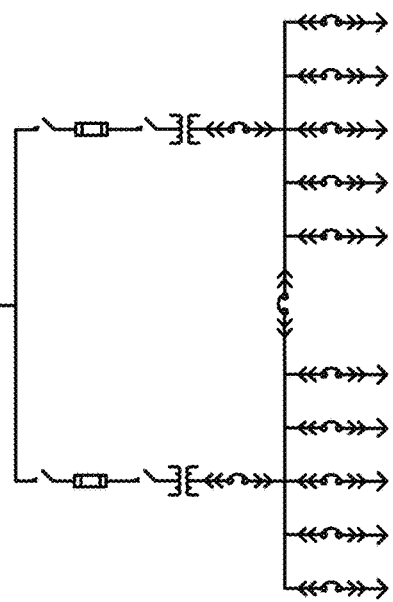
Figure 2A:
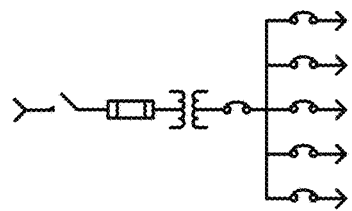
Figure 2C:
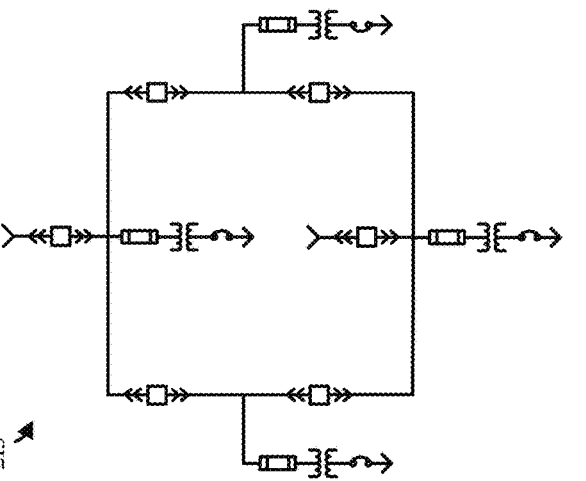

FIGS. 2A-2D illustrate several examples of common power topologies that may be discovered in a factory in accordance with embodiments of the present technology. FIG. 2A includes power system 205, FIG. 2B includes power system 210, FIG. 2C includes power system 215, and FIG. 2D includes power system 220. Power system 205 is representative of a simple radial system. Power system 210 is representative of a primary loop system. Power system 215 is representative of a primary ring bus system. Power system 220 is representative of a secondary selective system. The four topologies shown in FIGS. 2A-2D represent some main variants in power topology in order from simple (power system 205) to complex (power system 220). Generally, the electrical power topologies in a factory are simple and the main structure is tree-like, having hierarchical levels. Some protective connection in the entry lines often exist in the entry to guarantee continuous power supply over a fault.

Figure 3:
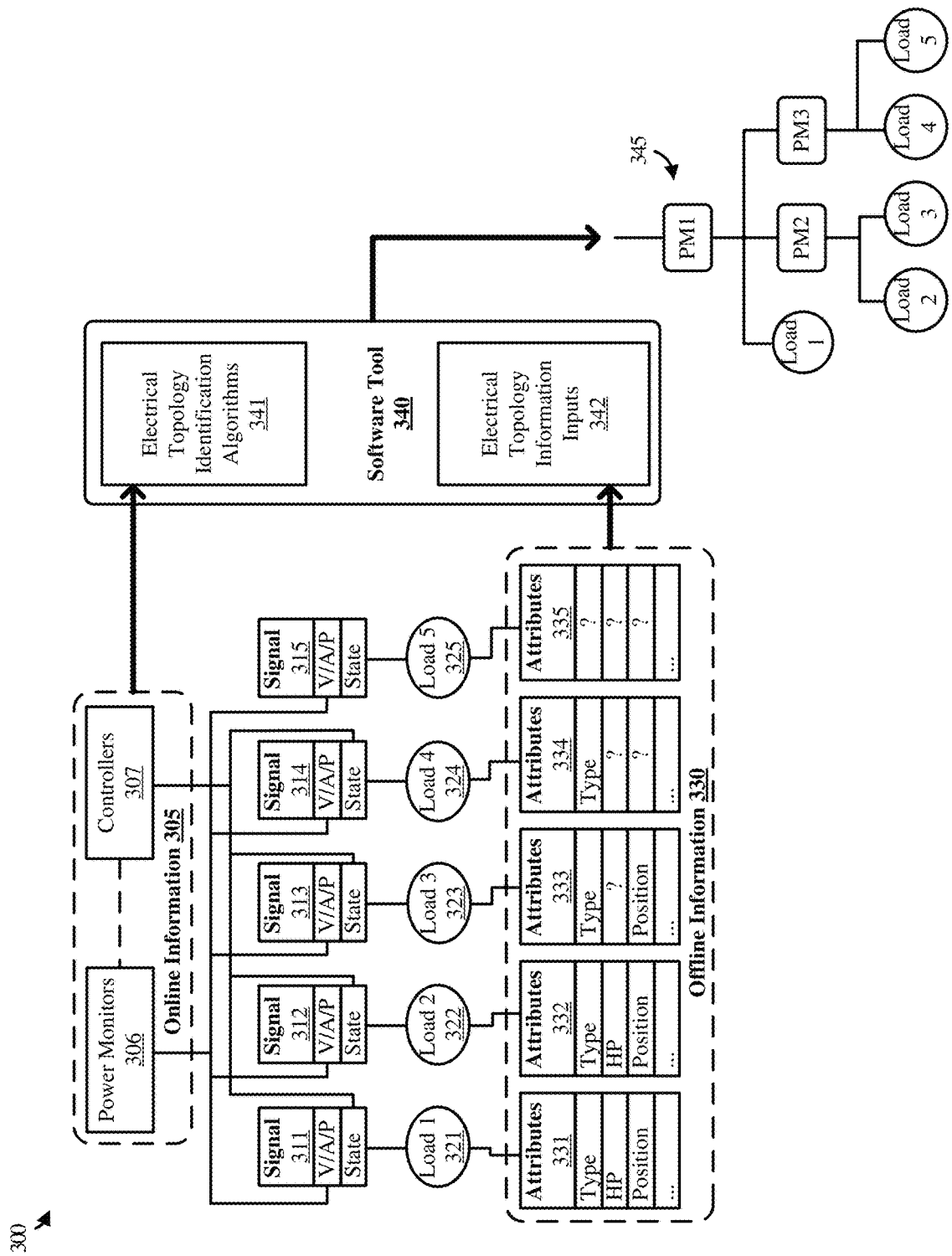
FIG. 3 illustrates an example of an unknown power topology scenario in accordance with some embodiments of the present technology.

As previously mentioned, one main problem addressed by the present technology is the lack of accurate electric network topologies in factories. FIG. 3 includes system 300 which illustrates this problem addressed by the present technology in addition to the solution disclosed herein. System 300 includes a power system having various loads. The power system comprises online information 305, which includes power monitors 306 and controllers 307. The power system further includes signal 311, signal 312, signal 313, signal 314, signal 315, load one 321, load two 322, load three, 323, load four 324, and load five 325. The power system further includes offline information 330, which includes attributes 331, attributes 332, attributes 333, attributes 334, and attributes 335. As shown, attributes 333, attributes 334, and attributes 335, include unknown information that may be discovered using the power topology discovery methods disclosed herein. System 300 further includes software tool 340, which comprises electrical topology identification algorithms 341 and electrical topology information inputs 342. Software tool 340 produces power topology schematic 345 using the systems and methods for automatic power topology discovery discussed herein.

The power system shown in FIG. 3 comprises various loads (i.e., load one 321, load two 322, load three, 323, load four 324, and load five 325), wherein each load has different attributes and signals available—some offline information (i.e., offline information 330) and some online information (i.e., online information 305). Information may come from a device itself or may come from a controller in some scenarios, in addition to other means. Software tool 340 integrates all of the available online information and offline information collected via electrical topology information inputs 342 and creates an accurate one-line diagram using electrical topology identification algorithms 341. Software tool 340 produces power topology schematic 345. Software tool 340 provides automatic power topology discovery and can be used to keep one-line diagrams updated as production facilities are updated, changed, and expanded.

Several example scenarios will now be described illustrating the differences in capabilities depending on how much information is available in a given scenario. The main differences between the described scenarios will include whether or not dynamic information (e.g., online operation information obtained from a network, controller, or server) and static information (e.g., offline configurations such as load type, rated power, etc.) are available. In a first example, a complete power load list is known. Additionally, the states and power measurements (i.e., V, I, P, Q) are partly known from information provided by one or more of the devices themselves, factory-level controllers, and factory-level (Open Platform Communications (OPC)) servers. This first example demonstrates an easier case, since information already known is mostly sufficient, and a user may need to only configure and get state and measurement information from load lists. The power topology can then be identified through state and measurement modeling and analysis.

In a second example, a complete power load list is known including the static information of all power loads from nameplate or device specifications. This known information may include load type, rated power, power factor, and similar. A case like this is common in industrial environments as many stand-alone power consumption devices may exist without network connection. In this scenario, load switching actions from power monitor measurements can be identified and then the matching loads corresponding to switching events can be found. Finally, power topology may be identified using the collected information. In another common scenario, a combination of the first example and the second example may exist such that some dynamic information is known in addition to the known static information. In a third example, hardly any information is known prior to topology discovery. In this scenario, it may be necessary to study papers for blind disaggregation, perform change detection to identify possible load patterns, and perform some simple user interaction for additional inputs and feedback. A case that includes a combination of the first example, second example, and third example exemplifies a practical situation to be solved with the power topology discovery methods herein.

A basic principle applied in power topology identification is the law of energy conservation—the power flow should be balanced along a path. If a load is downstream to a power monitor and there is a load change event, a same or similar change in real power should be observed in the load and power monitor. The more similar a change is, the higher the confidence is to be identified. Additional load changes are then used to recursively update the confidence of the power connection diagram. If all loads have changed, a connection diagram is theoretically fully identified.

Another key aspect involved in power topology discovery is the change detection and evaluation algorithm, where random variations and small changes should be omitted and real load changes should be detected. If the real load changes in power signals can be identified, which loads are causing the changes can be identified.

Figure 4:
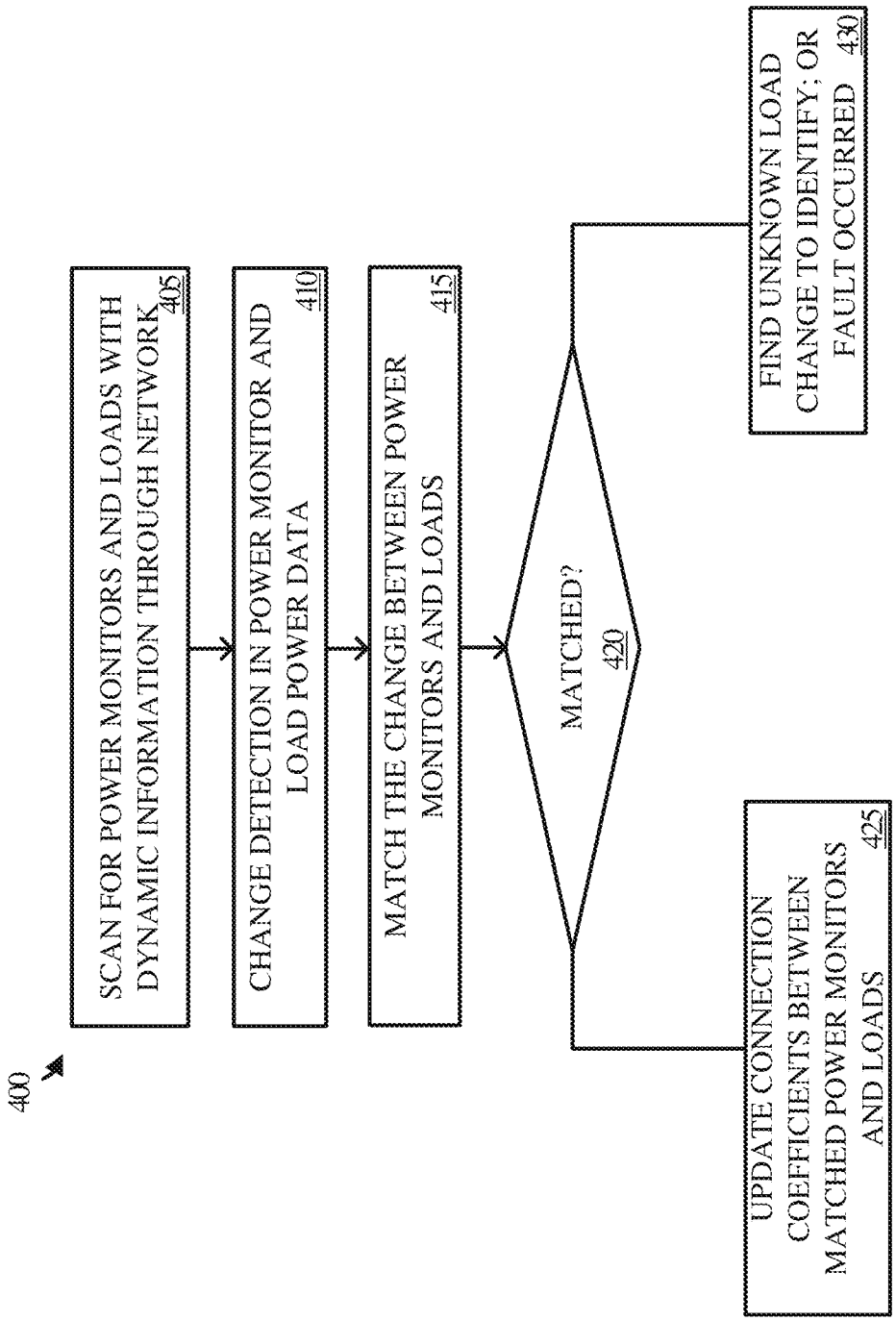
FIG. 4 illustrates a power topology discovery process in accordance with some embodiments of the present technology.

FIG. 4 illustrates power topology discovery process 400 which demonstrates a general procedure for identifying electrical power topology within a factory. In step 405, a topology discovery system scans for power monitors and loads with dynamic information provided through the network. In step 410, the topology discovery system detects changes in power monitor and load power data. If a significant change is detected, the topology discovery system matches the change between power monitors and loads in step 415. The system determines if the change can be matched between power monitors and loads in step 420. If the change can be matched, the connection coefficients between the matched power monitors and loads are updated in step 425. If the change cannot be matched, the system finds an unknown load change to identify or determines that a fault occurred in step 430. Power monitors are used as an example in power topology discovery process 400, however, power monitors may be replaced in this process by any other electric components including but not limited to circuit breakers, contactors, overload relays, and similar componentry.

Figure 5:
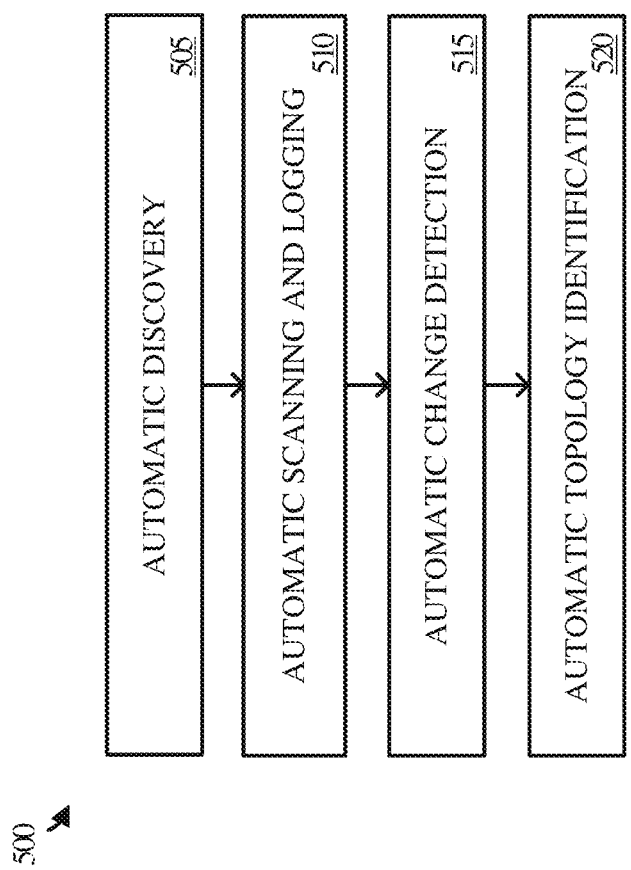
FIG. 5 illustrates a power topology identification process in accordance with some embodiments of the present technology.

FIG. 5 illustrates power topology discovery process 500 which will be used to describe a general framework for power topology identification. Power topology discovery process 500 includes four automatic procedures: automatic discovery (step 505), automatic scanning and logging (step 510), automatic change detection (step 515), and automatic topology identification (step 520). In some embodiments of the present technology, automatic discovery (step 505) is performed by one or more systems that manages networked devices, from which power devices may be automatically discovered to build the electrical power network. Via automatic browsing of the communication networks, newly offline and newly online devices may be discovered and used to build a power device list. In some examples, a network managing system provides a uniform interface to automatically discover which devices should be included in a power/energy device list used to build the topology diagram of the electrical power network. In an alternative example, a customized device list and corresponding communication path may be provided to the power devices.

A critical issue for power topology identification is data synchronization—power data sampled from power/energy devices must be synchronized for many applications. Generally, the minimum synchronization requirement for scanning and data logging requires that the synchronization error be much less than the sampling interval to guarantee that all devices can detect a change simultaneously. However, since the topology discovery method described herein is based on significant (i.e., clear) load changes, the synchronization accuracy does not need to be as high for the automatic scanning and data logging performed in power topology discovery process 500 (step 510). In some examples, a 15 to 60 second sampling interval may be satisfactory for scanning and logging in accordance with the present technology. Thus, the common scanning mechanism, controllers or OPC servers, is enough to meet the minimum synchronization requirement. Because the goal of power topology identification as described herein is to capture the steady-state data before and after a load change event and to estimate the change magnitude, time is not as critical.

Automatic change detection (step 515) plays an important role in power topology identification. In order to determine the hierarchical location of a device and to identify every device in an unknown topology, at least one change must be detected per device in accordance with the present technology. The change detection algorithm used satisfies the requirement that random noises and transient processes be excluded from analysis in order to find the real load changes and estimate change magnitude. From there, it is possible to match the change magnitude for upstream and downstream devices and estimate change magnitude. However, the inherent trade-off for change detection algorithms, false detection, and missing detection is handled by the present technology in that potentially missing some changes (i.e., failing to detect changes) is an acceptable weakness of the present technology because only a few accurate changes are sufficient to correctly identify the topology. Alternatively, false detection would be more detrimental for this purpose, as a high false detection rate may lead to an incorrect topology result. Thus, a large threshold for large changes will significantly decrease the false detection rate and increase the change detection matching accuracy. However, it may take more time to detect enough changes to identify the power topology than if a smaller threshold were used. Alternatively, a low threshold for small changes would increase the false detection rate and decrease the change detection matching accuracy. However, having more detected changes may help speed up the topology identification process and allow for more recursive updating of the confidence of the topology configuration, which may compensate for any mistakes in the change detection and matching.

Thus, while either method of change detection (i.e., large change vs. small change) can provide accurate results, using a relatively larger threshold, a more conservative approach, may be used to arrive at the correct power topology over time in accordance with some embodiments herein. However, a specific threshold to be set need not be specified, as many impacting factors such as the rated power level, measurement accuracy, and the like may impact a desired threshold value. In some implementations, the change detection algorithm used may provide a reference for selecting an appropriate threshold.

Automatic power topology specification (step 520) is founded in the law of energy conservation and Kirchhoff's current law—if a downstream device detects a change in current phasor or real power, a matching change should be found in one of its directly upstream devices. The matched changes among different devices can then be used as indicators of connections between devices, while un-matching changes may indicate that there is no direct relation between two devices. Once enough changes have been detected in a system (at least one change detected for each device), the upstream/downstream relationships can be identified in step 520.

The recursive power topology identification method used in accordance with some embodiments of the present technology is based on the Bayesian principle. The basic process of applying the Bayesian method to power topology identification starts with assigning each connection line in the topology (i.e., device list) an initial probability, wherein a probability of 1 represents a 100% probability of a connection (i.e., a direct upstream/downstream relation) and a probability of 0 represents a 0% probability of a connection (i.e., no upstream/downstream relation). A higher likelihood (i.e., closer to 1) represents a close change and a lower likelihood may represent a very different change (i.e., closer to 0, not matching). The likelihoods corresponding to topology probabilities are updated using the Bayesian formula, such that a higher likelihood causes a corresponding probability to increase and a lower likelihood causes a corresponding probability to decrease. The probabilities are recursively updated by calculating the likelihoods based on power change data such that the topology probabilities converge to 1 or 0 (or to near 1 and 0, e.g., 0.998) as the correct power topology is identified. This method may be applied to scenarios in which a single load change is used at a time and may similarly be applied for simultaneous or multi-load changes. Updating the probabilities may be based in part on the likelihoods of whether change loads should be under (i.e., downstream) one branch or located in separate branches.

The solution framework described in reference to FIG. 5 may be applied to networked power and energy devices that can provide state and/or power measurement data through the network. Un-networked devices may not be directly applied under this framework, since real-time data cannot be provided by these devices. However, it is possible to infer the topology of un-networked devices such as lighting and stand-alone motors. Under the same framework for change detection, it may be found that there is a change in one or several upstream devices which have a significant change in power or current, but there is not a matched load change in the monitored system (i.e., the online devices list). Based on this information, it may be reasonable to infer that an un-networked load exists under this branch. Furthermore, if the power characteristics from the un-matched change detected by upstream devices can be summarized and matched to the static information of the un-networked device features, it may be possible to infer that the change was caused by the matched device. Topology identification for un-networked devices may also be achieved using the Bayesian method to update the probability for the device.

FIG. 6 illustrates power topology discovering process 600 for discovering power topologies in accordance with aspects of the present technology. Power topology discovering process 600 starts with power device model 605. Power device model 605 includes offline information and online information. Offline information may include information such as type, rated current, and load. Online information may include information such as voltage, current, and power. In the present example, the offline information indicates that the device is an overload relay with a rated current of 30 A and a 30 HP inductor motor load. The online information includes voltage and current, but power is unavailable. Power device model 605 may include configurations for all potential online and offline information but is not required to be fully configured.

The second step in power topology discovering process 600 is power device list and event/data logging 610. In this step, device models are combined into a list with their available information and the devices may be classified into load and connector lists and recording are made of power events/data. A power event is shown in recorded data for power device 611, power device 612, power device 613, and power device 614. Power device 615 is shown as off and power device 616 is a new device without any recorded data yet. A power change recording is shown for each of the power devices. The recorded signatures for power device 611, power device 613, and power device 614 are identical, while the signature of the power change event recorded by power device 612, does not match the others. Based on the recorded data, automatic power topology discovery 620 is performed to produce topology diagram 621. Because of the matching device signatures, power device 613 and power device 614 are shown as being downstream from power device 611, while power device 615 is shown as being downstream from power device 612. Un-networked device 617 is downstream from power device 613 and power device 616 is shown without a connection. Topology diagram 621 is produced based on several power events. Topology diagram 621 may not be fully deduced based on the data shown in the present example and may include additional data from other power change events. For example, power device 615 is shown as being downstream from power device 612, which may have been determined at a different time since power device 615 is currently off in the present example.

To arrive at topology diagram 621 during automatic power topology discovery 620, the Bayesian formula is applied for automatic updating of topology probabilities. The probabilities are updated based on logged events and/or data until the result converges to the correct topology. In some examples, this process is performed offline in a batch manner based on historical data. In other examples, this process may be performed online, capturing real-time data and identifying topology information as events occur.

Figure 7:
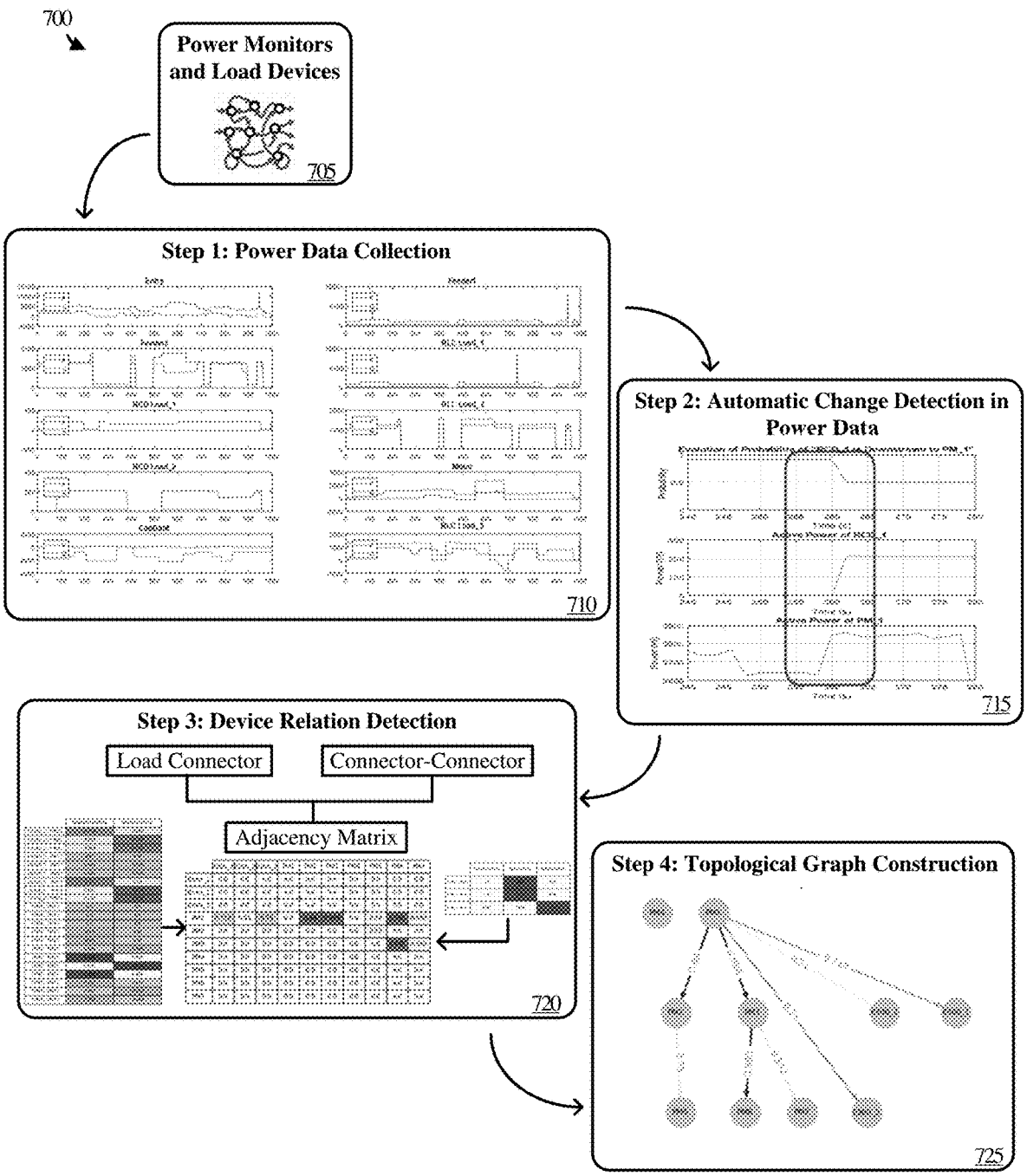
FIG. 7 illustrates a topological graph generation process in accordance with some embodiments of the present technology.

FIG. 7 illustrates process 700 which serves to demonstrate the overall process for automatic power topology discovery in accordance with embodiments of the present technology. Process 700 begins with data and configurations from power monitors and load device 705. Power monitors and load devices 705 may include various power devices with unknown relationships. From power monitors and load devices 705, the first step in process 700 is performed, power data collection 710. Power data collection 710 comprises collecting power-related time series data for power monitors and load devices 705. Power-related time series data may include voltage data, current data, power data, charge data, and similar time series metrics.

The second step in process 700, automatic change detection in power data 715, comprises detecting power change events in the time series data for the devices. A single power change event may be detected in a single device or in multiple devices. To generate a complete topological diagram, at least one power change event must be recorded for each device to identify upstream and downstream relationships. A power change event may include an increase in a power-related metric, a decrease, a temporary spike or drop, and the like.

The third step in process 700, device relation detection 720, includes detecting device relationships based on the detected power changes in the previous step. Device relation detection includes updating a topology relation probability matrix based on the Bayesian theory. Load-connector and connector-connector relations are used to generate the adjacency matrix. Construction of the adjacency matrix will be described in greater detail in reference to FIGS. 10A-10F.

The fourth step in process 700, topological graph construction 725, includes generating a graph based on graph theory, wherein the graph illustrates connections between devices and probabilities for those connections. In some examples, the graph is a directed graph drawn based on the adjacency matrix, wherein directed edges represent downstream connections to other devices.

Figure 8:
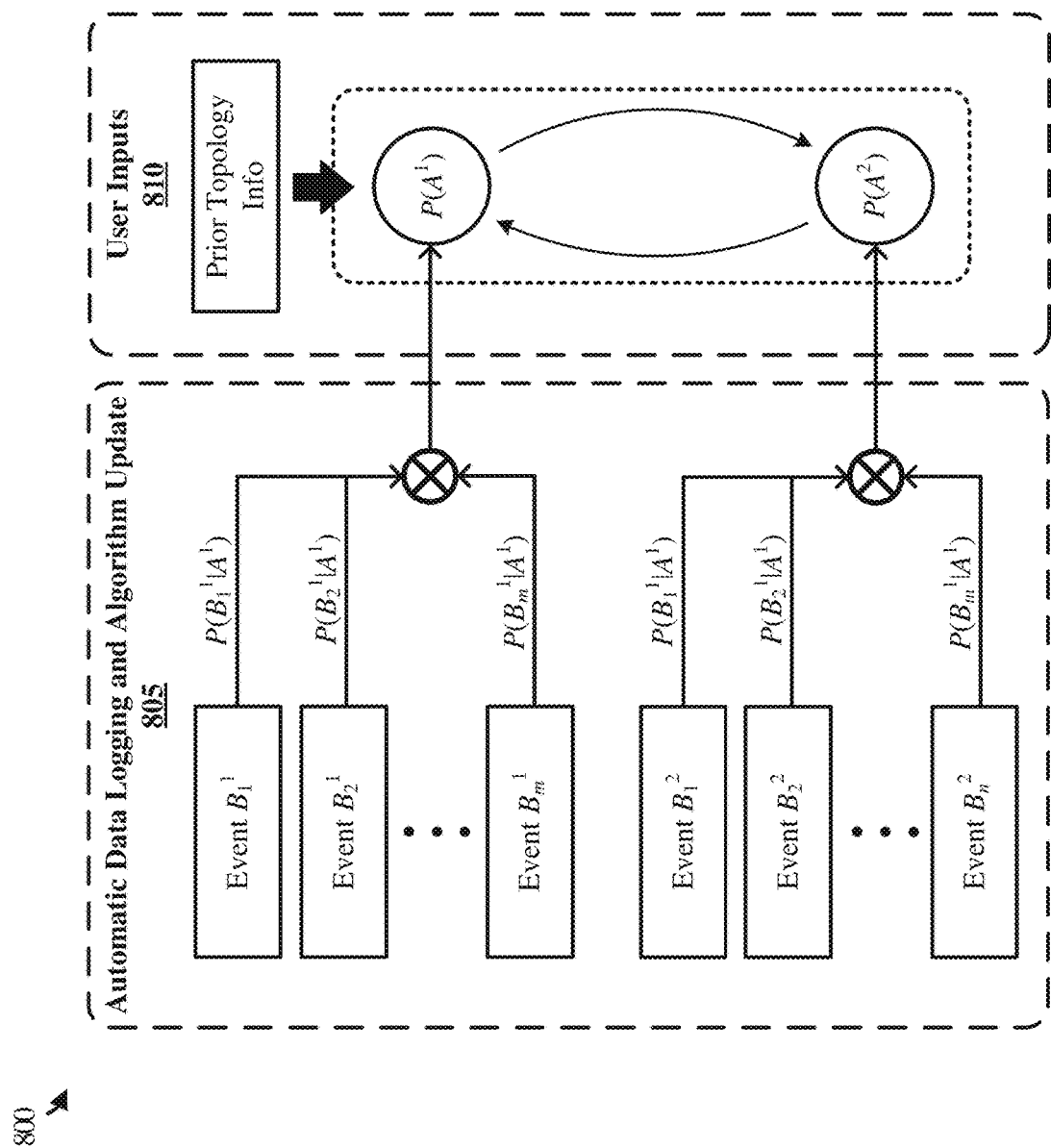
FIG. 8 illustrates Bayes' theorem as may be applied to power topology problems in accordance with some embodiments of the present technology.

FIG. 8 illustrates a general diagram of the Bayesian method for power topology identification. Diagram 800 includes automatic data logging and algorithm update 805 and user inputs 810. The Bayesian method is based in Bayes' Theorem:

$$P(A|B) = \frac{P(B|A) \cdot P(A)}{P(B)} = \frac{P(B|A) \cdot P(A)}{P(B|A) \cdot P(A) + P(B|\overline{A}) \cdot P(\overline{A})},$$

where P(A) and P(B) represent the probabilities of A and B without regards to each other, P(A|B) is the conditional probability of observing event A given that event B is true, P(B|A) is the conditional probability of observing event B given that event A is true, P($\overline{A}$) is the probability that event A is false, and P(B|$\overline{A}$) is the conditional probability of observing event B given that event A is false. P(A) is referred to as prior probability while P(A|B) is referred to as the posterior probability. Bayes' theorem states a process in which a supposition is revised in an event (i.e., conditional probability of the event) after observing another related event.

In some embodiments, the Bayesian method may recursively update the posterior probability of the assumptions (event A) from the observed phenomenon (event B) until arriving at an accurate topology. When applying Bayes' theorem as discussed above to factory topology identification, event A represents any assumption for a potential power topology structure, wherein examples of assumptions include: a first device is downstream from a second device, a potential combination of circuit breakers' statuses, a graphical representation of potential connections, and the existence or non-existence of an offline or unknown load/ branch. Event B represents any monitored event or data related to the power topology, wherein examples may include voltage, current, real and reactive power measurements, operation states of loads, power quality indexes and events such as harmonies, unbalance, and sag, captured waveform of voltage and current, and properties of transient events, such as event sequences in a system. The likelihood, P(A|B), represents a likelihood of the monitored events and data under a specific topology assumption, which may be determined based on proper circuit laws and noise statistics. From these variables, the Bayesian formula may be applied to identify factory power topology based on a few assumptions.

A first set of assumptions is made based on all potential topology structures. Assumptions may include, for example, an initial upstream/downstream relation matrix for all devices, a possible tree structure of all devices, combinations of unknown circuit breaker statuses, and the existence of an offline branch or load. After the first set of assumptions is made, it is checked, for each assumption, whether the monitored events and/or data match the assumption, (i.e., calculate the likelihood P(A|B)). If the events and/or data match the assumption (i.e., P(B|A) is larger than P(B|$\overline{A}$)), then the posterior probability of this topology assumption increases. If the events and/or data do not match the assumption (i.e., P(B|A) is smaller than P(B|$\overline{A}$), the posterior probability of this topology assumption decreases. In an example, it may be checked using circuit laws whether, under a specific tree structure assumption, the voltage, current, and power of the devices satisfies their corresponding relations. From the monitored power events and data (event B), the probabilities of various power topology assumptions are recursively updated based on circuit laws and noise statistics, where the correct topology assumption will converge to a probability of 1, and the other topology assumptions will converge to a probability of 0.

Put simply, applying the Bayesian method to power topology discovery is a process of making the proper assumptions and then verifying them. If the topology is unknown, calculations based on circuit laws cannot work. However, if specific assumptions are made (i.e., a fixed assumed topology), circuit calculations can be made to check whether the recorded events and/or data satisfy the circuit laws. Thus, the Bayesian method allows those circuit laws to be applicable to an unknown scenario and the topology identification problem transforms into a verification problem.

Referring back to FIG. 8 and diagram 800 depicting the Bayesian method as applied to power topology identification, automatic data logging and algorithm update 805 includes power change events (i.e., $B_1^1, B_2^1, \ldots, B_m^1$, and $B_1^2, B_2^2, \ldots, B_n^2$) that may be useful in identifying the power topology. User inputs 810 includes prior topology information and all potential assumptions of the power topology that are to be solved. There may be different methods for describing the topology (i.e., different groups of topology assumptions). Each topology assumption (i.e., $A^1$, $A^2, \ldots$) has a corresponding event type (i.e., $B_t^1$, $B_t^2, \ldots$), and each topology assumption includes a set of assumptions (i.e., $\{A_1^k \ldots A_n^k\}$) to be verified from the corresponding events/data. When the probability of one assumption is updated, other assumptions may be updated as a result as the system topology is solved.

In the example of FIG. 8, $A^1$ is the upstream/downstream probability matrix of networked devices, where $A_{xy}^1$ is the probability that device$_x$ is downstream of device$_y$. $A^2$ is the probability matrix of the on/off statuses of circuit breakers that have no network connection and $A^3$ is probability matrix of locations of stand-alone motors. Each time an event, $B_t^k$, is observed, the Bayesian formula is used to update the posterior probability of topology assumption $A^k$, wherein the posterior probability of assumption $A^k$ is expressed as:

Posterior($A^k$)∝ΠP($B_t^k|A^k$)·Prior($A^k$), and wherein the update corresponds to a chain rule updating multiple events (i.e., the posterior probability updated by the first even is taken as the prior probability of the second event).

The prior information provided via user inputs can narrow down the verification scope of all possible topology assumptions (i.e., the scope of $A^k$), thereby allowing for faster and more accurate topology identification. Depending on a given scenario, users may have some prior information about the topology (e.g., some connections between some of the devices) and some prior information about the classifications of device types (e.g., load devices are located in the leaf node of a hierarchical tree topology and connector devices, such as power monitors and circuit breakers, may be located on the upstream side).

The framework shown in FIG. 8 serves as a general framework for applying the Bayesian method to power topology identification and does not have specific requirements for the details of the topology assumption, events, and data. There may be many different power topology problems solved, but they may be included in the same general framework. In the present scenario, as previously mentioned, $A^1$ is the upstream/downstream relation matrix. In this scenario, $A^1$ is a N×N matrix for N devices in a system, each element $A_{ij}^1$ represents that the i-th device is downstream to the j-th device, $\overline{A_{ij}^1}$ means no such relation, and the posterior probability of $A_{ij}^1$ is $$P(A_{ij}^1 | B_{ijt}^1) = \frac{P(B_{ijt}^1 | A_{ij}^1) \cdot P(A_{ij}^1)}{P(B_{ijt}^1 | A_{ij}^1) \cdot P(A_{ij}^1) + P(B_{ijt}^1 | \overline{A_{ij}^1}) \cdot P(\overline{A_{ij}^1})}.$$

In the present example, $A^2$ is the on/off status of two circuit breakers with no network connection. In this scenario, $A^2=\{A_1^2, A_2^2, A_3^2, A_4^2\}$ contains all four possible assumptions: $A_1^2 \triangleq CB_1$ Open & $CB_2$ Open, $A_2^2 \triangleq CB_1$ Open & $CB_2$ Close, $A_3^2 \triangleq CB_1$ Close & $CB_2$ Open, $A_4^2 \triangleq CB_1$ Close & $CB_2$ Close, and the posterior probability of $A^2$ is updated by its corresponding series of data $B_k^2$ and is expressed as $$P(A_i^2 | B_t^2) = \frac{P(B_t^2 | A_i^2) P(A_i^2)}{P(B_t^2)} \text{ and}$$

$$P(B_t^2) = \sum_{i=1}^{4} P(B_t^2 | A_i^2) P(A_i^2).$$

Furthermore, in this scenario, $A^3$ is the existence of an un-networked load. Thus, $A^3=\{A_1^3, A_2^3, \ldots\}$ represents the existence or the non-existence of an un-networked device in a specific place, wherein the posterior probability is updated in the same way as $A^2$.

One advantage of the application of the Bayesian method to power topology discovery as described herein is the implicit robustness to bad data. It is sufficient to converge to the correct topology. The likelihood of a correct data event is larger than that of an incorrect data event, so the method is robust to measurement error, noise, and inaccurate data synchronism.

If possible, it may be advantageous to divide all devices in to two basic types for topology identification, which can largely reduce the problem complexity and improve accuracy. Devices may be divided into end load devices (e.g., motor, heater, light, HVAC, arc furnace, capacitor bank, etc.) and connectors (e.g., transformers, circuit breakers, power monitors, etc.). The end load is the lowest topology level—it is not upstream of any other devices, so the probability that an end load is upstream to other devices need not be calculated using the Bayesian formula. Connectors, alternatively, are upstream to end loads, but may be upstream or downstream of one another. Classifying power device types in this way may simplify the topology identification process because only the topology of end loads to connectors and the topology among connectors needs to be identified, and change detection can be focused in end loads.

Once power data is collected for networked devices, an effective change detection and estimation algorithm may be applied using the recorded power data to calculate likelihoods. The likelihood calculation is based on change magnitude estimation and noise statistics under steady-state operations. One example of a change detection and estimation algorithm that may be used in implementations of the present technology is the classical cumulative sum (CUSUM) algorithm. The CUSUM algorithm may be used to estimate and track random series with both abrupt and slow drift change. When the raw data series is relatively steady, it is an exponential smoothing (i.e., averaging) of the raw data series. When a change is detected, both abrupt and slow drift change, the filtering output is reset to the current value of the raw data series. The change magnitude can be estimated at the reset action instant.

Figure 9:
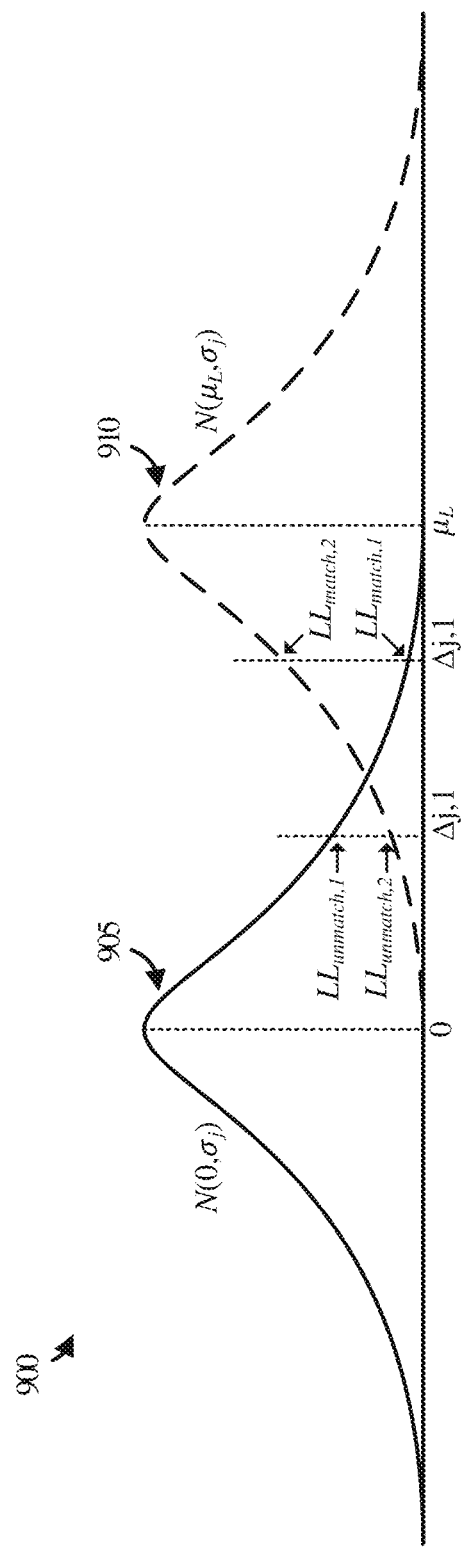
FIG. 9 illustrates a graph depicting likelihood calculations in accordance with some embodiments of the present technology.

FIG. 9 includes graph 900 illustrating how the likelihood of a topology may be calculated. After successful change detection, the degrees of matching across the devices may be calculated (i.e., likelihood calculations). In order to make these calculations, some assumptions are made. It is assumed that a load change has been detected and the change magnitude is estimated as $\mu_L$, while the j-th connector's change is estimated as $\Delta_j$. It is further assumed that the j-th connector's power change has a Gaussian distribution, N(0, $\sigma_j$), under no load change event, where $\sigma_j$ may be estimated from historical data or manually set as a relatively large value. As illustrated in FIG. 9, if the i-th connector is not upstream of a load, it is more likely located in N(0,$\sigma_j$), curve 905 (i.e., $\Delta_j$ should be small: $0 \approx \Delta_j \ll \mu_L$). In that case, $LL_{unmatch} > LL_{match}$. Alternatively, if the i-th connector is upstream of a load, it is more likely located in N($\mu_L$,$\sigma_j$), curve 910 (i.e. $\Delta_j$ should be small: $0 \ll \Delta_j \approx \mu_L$). In that case, $LL_{match} > LL_{unmatch}$. The likelihood value is therefore calculated by the probability density function of the respective Gaussian distribution curve.

Figure 10A:
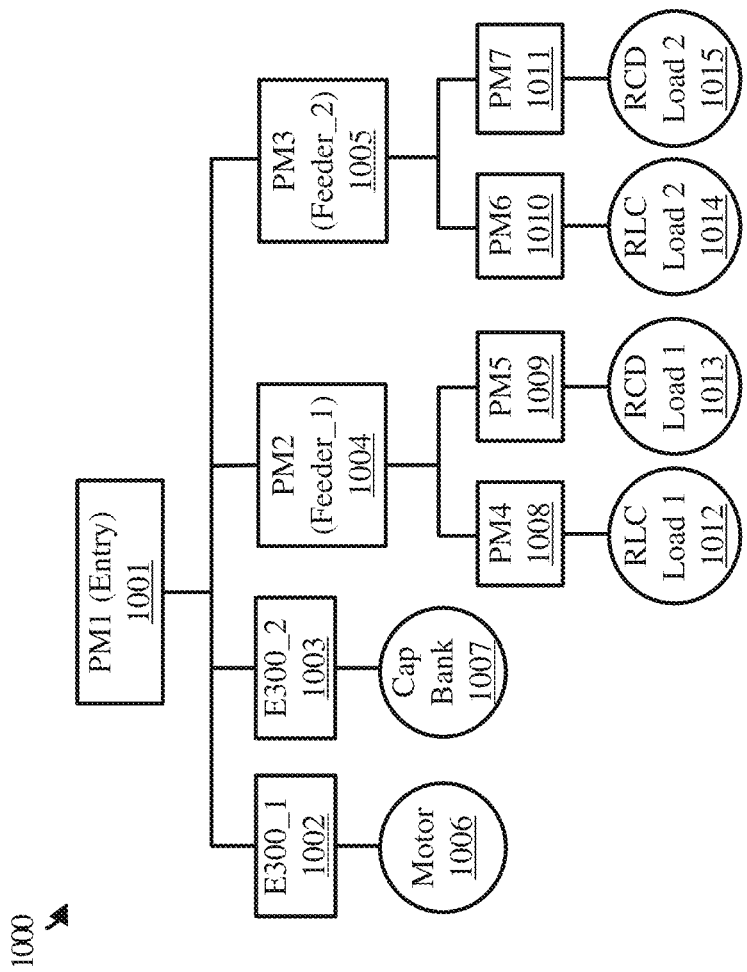

FIGS. 10A-10F illustrate an experimental example for generating a topological graph based on relation probabilities. FIG. 10A includes factory topology 1000 which may be identified using the topology discovery methods described herein. Factory topology 1000 includes power monitor 1 (PM1) 1001 (Entry), E300_1 1002 (overload relay), E300_2 1003 (overload relay), PM2 1004 (Feeder_1), PM3 1005 (Feeder_2), motor 1006, capacitor bank 1007, PM4 1008, PM5 1009, PM6 1010, PM7 1011, RLC Load 1 1012, RCD Load 1 1013, RLC Load 2 1014, and RCD Load 2 1015. Factory topology 1000 is entirely or partially unknown when the topology discovery process begins. In some examples, the process may begin with a list of known devices, wherein some or all of the devices in factory topology 1000 are known to exist before initiating topology discovery.

FIG. 10B shows connector-connector relations table 1020. Connector-connector relations table 1020 shows the initiation values of connection relations, or the initial assumptions for Bayes theorem. A connector-connector relationship may have three types: downstream, upstream, and no relation. Each relationship probability is initiated as ⅓ (i.e., 0.333). As shown, the connector-connector relations for which the probability is initiated in the table include the relationships between the entry and the feeders from factory topology 1000: PM1 and PM2, PM1 and PM3, and PM2 and PM3.

FIG. 10C shows load-connector relations table 1025. Load-connector relations table 1025 shows the initiation value of load-connector relations, or the initial assumptions for Bayes theorem. Each load-connector relation may have two types: downstream and no relation. Thus, each relationship probability is initiated as ½ (i.e., 0.5). Load-connector relations shown in load-connector relations table 1025 include the relationships between: PM4 and PM1, PM4 and PM2, PM4 and PM3, PM5 and PM1, PM5 and PM2, PM5 and PM3, PM6 and PM1, PM6 and PM2, PM6 and PM3, PM7 and PM1, PM7 and PM2, PM7 and PM3, E300_2 and PM1, E300_2 and PM2, E300_2 and PM3, E300_1 and PM1, E300_1 and PM2, and E300_1 and PM3.

Figure 10D:
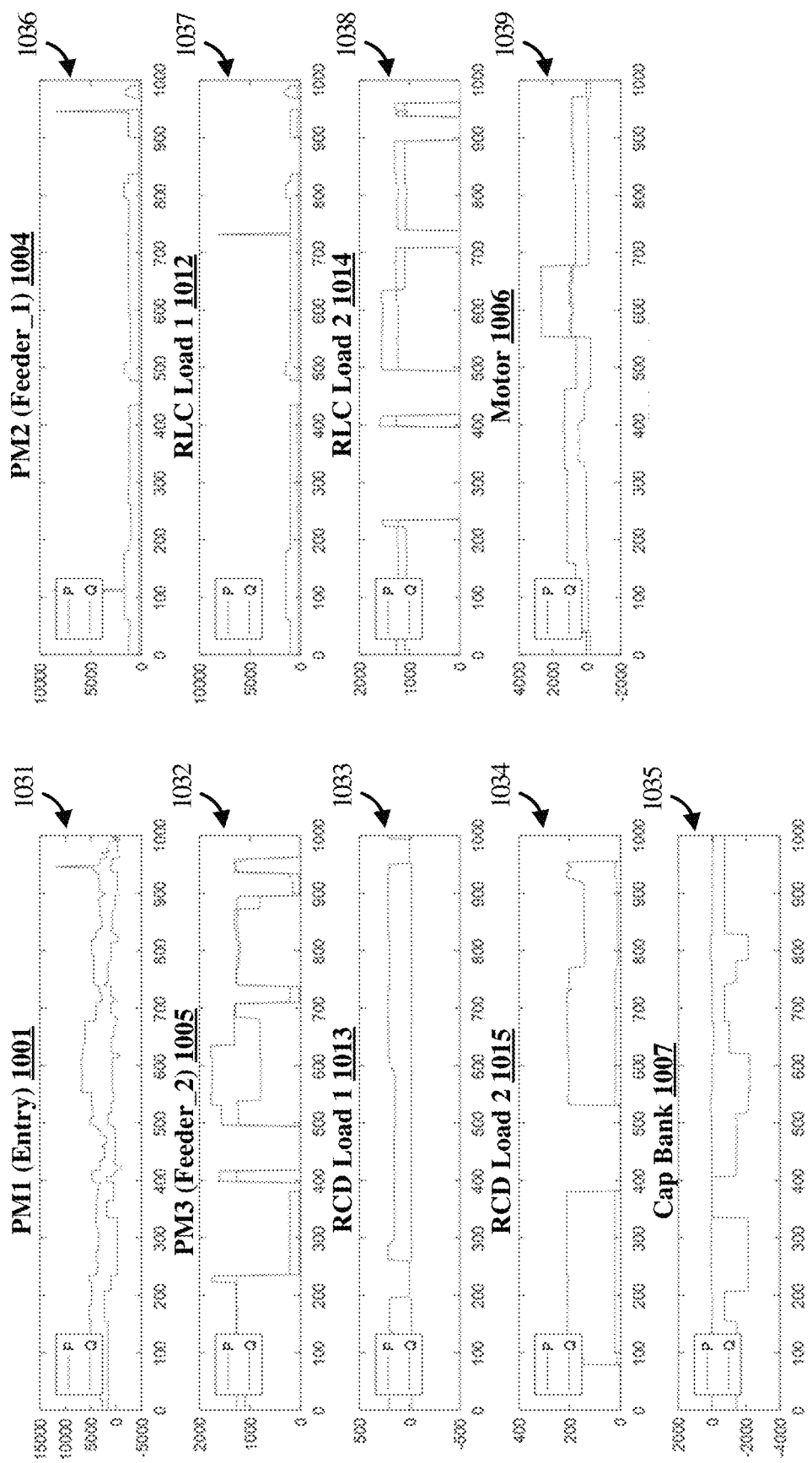

FIG. 10D shows experimental data of real and reactive power for devices from factory topology 1000. The real and reactive power for the devices in factory topology 1000 is used to identify upstream and downstream relationships between devices with Bayes theorem. Graph 1031 shows power data for PM1 1001, graph 1031 shows power data for PM3 1005, graph 1033 shows power data for RCD Load 1 1013, graph 1034 shows power data for RCD Load 2 1015, graph 1035 shows power data for capacitor bank 1007, graph 1036 shows power data for PM2 1004, graph 1037 shows power data for RLC Load 1 1012, and graph 1039 shows power data for motor 1006. The experimental power data collected is used to recursively update the initiated probability graphs over time to arrive at an adjacency matrix indicating actual probabilities of upstream/downstream connections.

Figure 10E:

FIG. 10E includes adjacency matrix 1050, which is synchronously constructed and updated from connector-connector relations table 1020 and load-connector relations table 1025. Update rules for adjacency matrix 1050 include: the value of each cell (i.e., val(i, j)) denotes the downstream probability of device i to device j, the matrix value is mapped from the connector-connector and load-connector relation matrices shown in FIGS. 10B and 10C, only when the downstream probability in the load-connector and connector-connector relation matrix is larger than 0.5, the value of a cell is updated (otherwise set as 0), and the nearer to 1 the value of a cell is, the higher confidence there is that device i is downstream of device j.

Figure 10F:
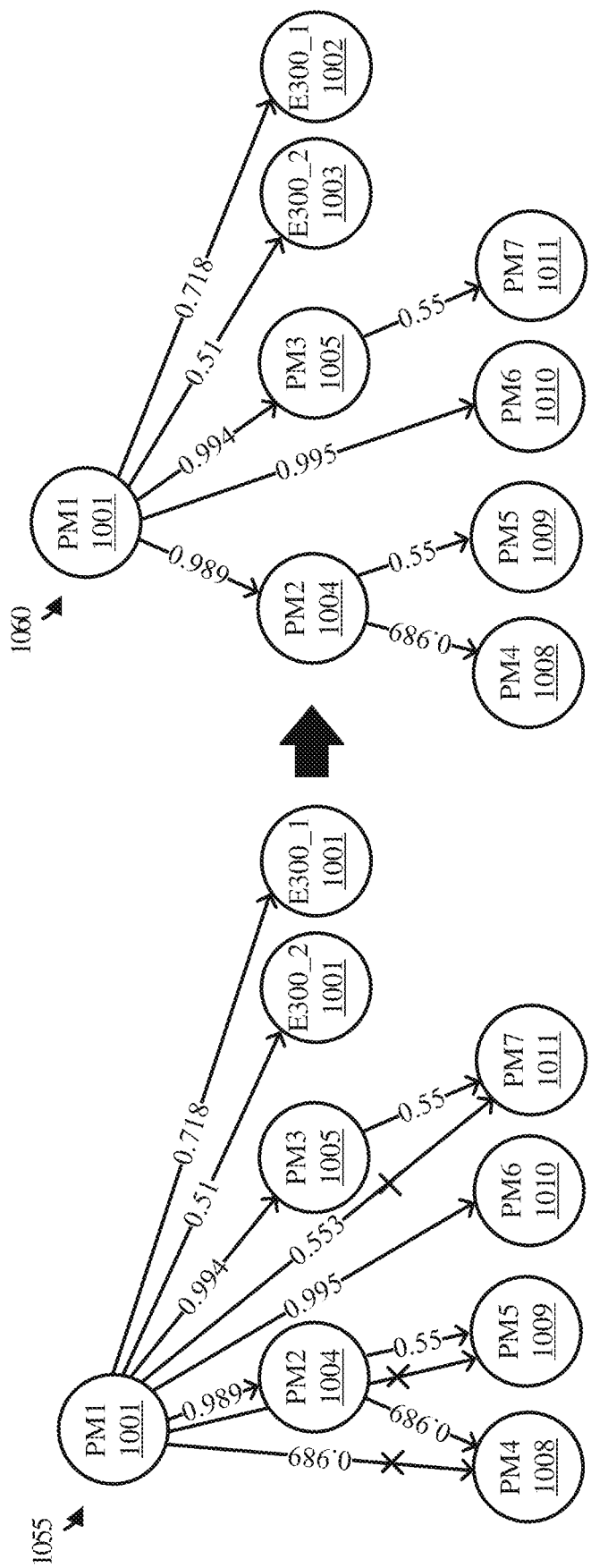

FIG. 10F illustrates topological graph construction based on relation probabilities from adjacency matrix 1050. Graph 1055 is the original graph drawn from adjacency matrix 1050. Graph 1055 and graph 1060 are directed graphs having nodes connected by edges. Each edge is labeled with a corresponding probability of the represented relationship. Graph 1055 includes several redundancies—connection edges that represent the shortest path between nodes when a longer path exists. These redundancies are removed from graph 1055 to create graph 1060. The shortest path redundancies can be discovered through graph theory and then removed. Graph 1060 represents the final result in some examples of the factory topology discovery process described herein. Graph 1060 accurately represents factory topology 1000.

The topology discovery process described in FIGS. 10A-10F serves to describe power topology problems under a uniform probabilistic framework from which all other topology information (i.e., offline, online, semantics, data, etc.) can be used in the same manner—these methods can then be used for calculating the likelihood of any observation from which the posterior probability can be calculated from the prior probability. The systems and methods for factory topology discovery are not only able to identify the topology of networked power devices, such as power monitors and drives, but can also be used to identify the topology of devices with limited status and measurements or without network communication capability. The proposed solution has an inherent property of robustness in that the convergence to a correct power topology result is not impacted by some bad event records and data if there are more good event records and data. The dynamic power topological graph generated based on device connection probabilities provides a straight-forward hierarchical virtualization of the power devices in a factory. Furthermore, the continuous monitoring of power signatures also works for power system diagnostics—a new event may not only be used to update previous probabilities, but also to verify whether it matches previously identified topology in order to detect potential faults or abnormal conditions in a power system.

Figure 11:
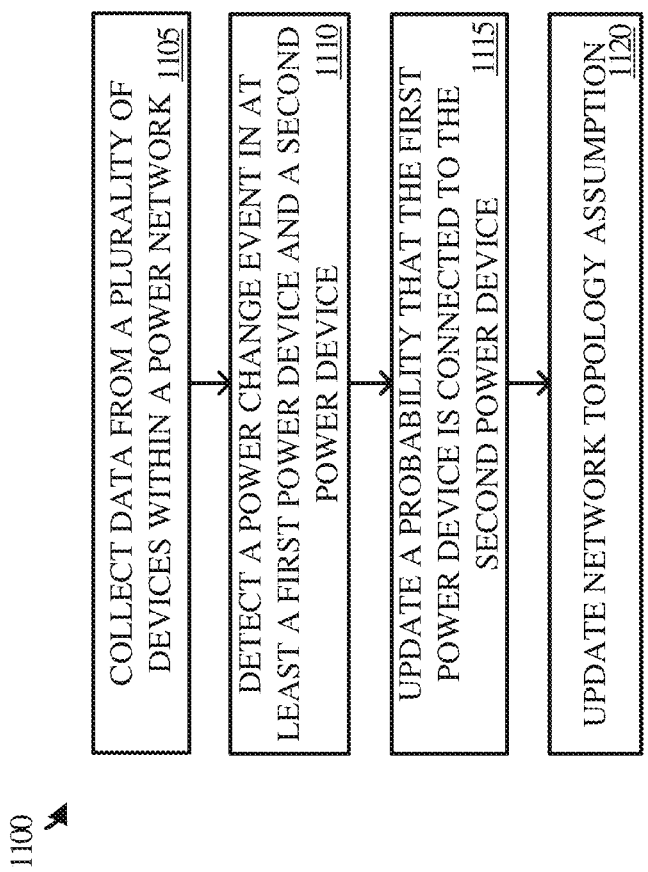
FIG. 11 illustrates a power topology discovery process in accordance with some embodiments of the present technology.

FIG. 11 illustrates process 1100 for automatic power network topology discovery in accordance with some implementations of the present technology. In step 1105, power data is collected from a plurality of devices in a factory power network. In some examples, power devices are monitored in real-time such that a power topology is recursively updated each time a power change event is detected. In step 1110, a power change event is detected in at least a first power device and a second power device. In some examples, many devices within the power network experience the power change event, as is evidenced by their power signatures. The power change event signatures may match across devices, indicating that the subset of devices that experienced the power change can be determined to have upstream/downstream relationships. In response to detecting the power change event across a subset of power devices, the probabilities of connections may be updated. In step 1115, a probability that the first second is connected to the second power device is updated.

In some examples, updating the probability of a connection between devices includes updating a relationship matrix such as those shown in FIGS. 10B, 10C, and 10E. In the present example, the first device and the second device both detect the power change event, and their relationship probability is therefore updated. In many examples, many more devices may also detect the power change event, and the probabilities of connections are updated for all of the devices that detected the matching power change event.

In step 1120, the network topology assumption is updated. In some examples, updating the network topology assumption includes updating an adjacency matrix, such as that shown in the example of FIG. 10E. Step 1120 may further include generating or updating a topology graph based on the adjacency matrix. In some examples, the updates in the example of process 1100 may be the first updates to occur after the initiation of the assumptions, while in other examples, the power change event may be later on in the process, such that an accurate topology is achieved or nearly achieved.

Figure 12:
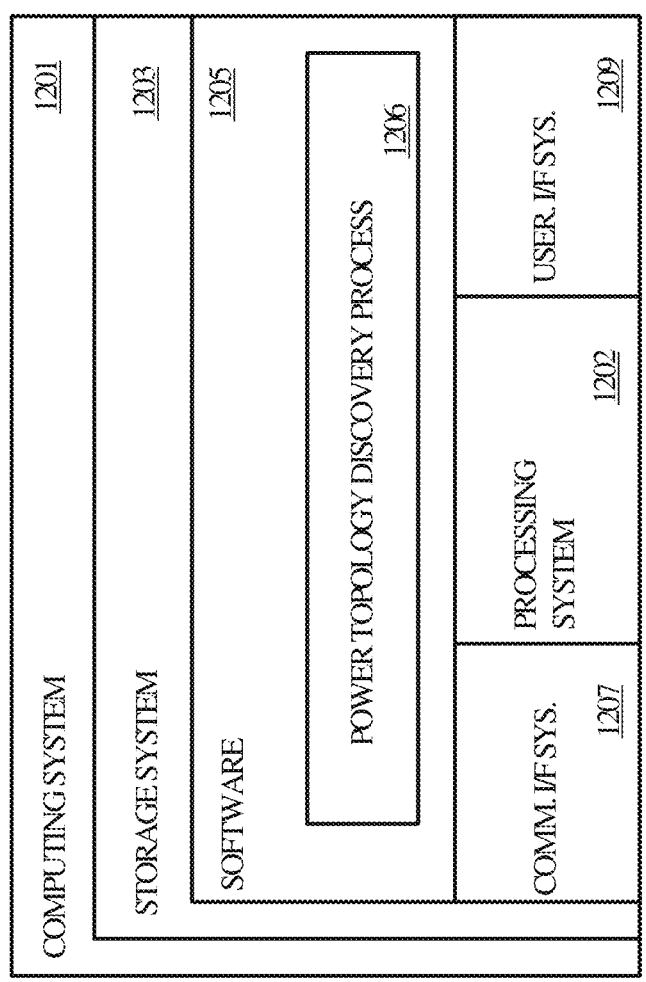
FIG. 12 illustrates a computing device that may be used for power topology discovery in accordance with some embodiments of the present technology.

FIG. 12 illustrates computing system 1201 to perform power topology discovery according to an implementation of the present technology. Computing system 1201 is representative of any system or collection of systems with which the various operational architectures, processes, scenarios, and sequences disclosed herein for power topology discovery may be employed. Computing system 1201 may be implemented as a single apparatus, system, or device or may be implemented in a distributed manner as multiple apparatuses, systems, or devices. Computing system 1201 includes, but is not limited to, processing system 1202, storage system 1203, software 1205, communication interface system 1207, and user interface system 1209 (optional). Processing system 1202 is operatively coupled with storage system 1203, communication interface system 1207, and user interface system 1209.

Processing system 1202 loads and executes software 1205 from storage system 1203. Software 1205 includes and implements power topology discovery process 1206, which is representative of the power topology identification processes discussed with respect to the preceding Figures. When executed by processing system 1202 to provide power topology identification functions, software 1205 directs processing system 1202 to operate as described herein for at least the various processes, operational scenarios, and sequences discussed in the foregoing implementations. Computing system 1201 may optionally include additional devices, features, or functionality not discussed for purposes of brevity.

Referring still to FIG. 12, processing system 1202 may comprise a micro-processor and other circuitry that retrieves and executes software 1205 from storage system 1203. Processing system 1202 may be implemented within a single processing device but may also be distributed across multiple processing devices or sub-systems that cooperate in executing program instructions. Examples of processing system 1202 include general purpose central processing units, graphical processing units, application specific processors, and logic devices, as well as any other type of processing device, combinations, or variations thereof.

Storage system 1203 may comprise any computer readable storage media readable by processing system 1202 and capable of storing software 1205. Storage system 1203 may include volatile and nonvolatile, removable and non-removable media implemented in any method or technology for storage of information, such as computer readable instructions, data structures, program modules, or other data. Examples of storage media include random access memory, read only memory, magnetic disks, optical disks, optical media, flash memory, virtual memory and non-virtual memory, magnetic cassettes, magnetic tape, magnetic disk storage or other magnetic storage devices, or any other suitable storage media. In no case is the computer readable storage media a propagated signal.

In addition to computer readable storage media, in some implementations storage system 1203 may also include computer readable communication media over which at least some of software 1205 may be communicated internally or externally. Storage system 1203 may be implemented as a single storage device but may also be implemented across multiple storage devices or sub-systems co-located or distributed relative to each other. Storage system 1203 may comprise additional elements, such as a controller, capable of communicating with processing system 1202 or possibly other systems.

Software 1205 (including power topology discovery process 1206) may be implemented in program instructions and among other functions may, when executed by processing system 1202, direct processing system 1202 to operate as described with respect to the various operational scenarios, sequences, and processes illustrated herein. For example, software 1205 may include program instructions for implementing power topology discovery methods for factories as described herein.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Software 1205 may include additional processes, programs, or components, such as operating system software, virtualization software, or other application software. Software 1205 may also comprise firmware or some other form of machine-readable processing instructions executable by processing system 1202.

In general, software 1205 may, when loaded into processing system 1202 and executed, transform a suitable apparatus, system, or device (of which computing system 1201 is representative) overall from a general-purpose computing system into a special-purpose computing system customized to provide power topology identification as described herein. Indeed, encoding software 1205 on storage system 1203 may transform the physical structure of storage system 1203. The specific transformation of the physical structure may depend on various factors in different implementations of this description. Examples of such factors may include, but are not limited to, the technology used to implement the storage media of storage system 1203 and whether the computer-storage media are characterized as primary or secondary storage, as well as other factors.

For example, if the computer readable storage media are implemented as semiconductor-based memory, software 1205 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Communication interface system 1207 may include communication connections and devices that allow for communication with other computing systems (not shown) over communication networks (not shown). Examples of connections and devices that together allow for inter-system communication may include network interface cards, antennas, power amplifiers, radiofrequency circuitry, transceivers, and other communication circuitry. The connections and devices may communicate over communication media to exchange communications with other computing systems or networks of systems, such as metal, glass, air, or any other suitable communication media. The aforementioned media, connections, and devices are well known and need not be discussed at length here.

Communication between computing system 1201 and other computing systems (not shown), may occur over a communication network or networks and in accordance with various communication protocols, combinations of protocols, or variations thereof. Examples include intranets, internets, the Internet, local area networks, wide area networks, wireless networks, wired networks, virtual networks, software defined networks, data center buses and backplanes, or any other type of network, combination of networks, or variation thereof. The aforementioned communication networks and protocols are well known and need not be discussed at length here.

While some examples provided herein are described in the context of factory topology discovery, it should be understood the power topology discovery methods described herein are not limited to such embodiments and may apply to a variety of other environments and their associated systems. As will be appreciated by one skilled in the art, aspects of the present invention may be embodied as a system, method, computer program product, and other configurable systems. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for" but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A method of identifying power network topology, the method comprising:
    collecting power data from a plurality of devices within a power network;
    detecting a power change event in at least a first power device of the plurality of devices and a second power device of the plurality of devices;
    identifying, in at least a portion of the power data associated with the power change event, a power signature of the first power device and a power signature of the second power device;
    updating a probability that the first power device is connected to the second power device based on the power signature of the first power device and the power signature of the second power device; and
    generating a network topology diagram, wherein the network topology diagram reflects the probability that the first power device is connected to the second power device.

2. The method of claim 1, further comprising updating a network topology assumption based on the updated probability that the first power device is connected to the second power device, wherein the network topology assumption includes a hierarchical relationship between the first power device and the second power device.

3. The method of claim 2, wherein the hierarchical relationship between the first power device and the second power device is that the first power device is downstream of the second power device.

4. The method of claim 1, wherein updating the probability that the first power device is connected to the second power device comprises updating a probability that the first power device is downstream of the second power device in the power network.

5. The method of claim 1, wherein updating the probability that the first power device is connected to the second power device comprises updating an adjacency matrix, wherein the adjacency matrix maps probabilities of relationships between the plurality of devices.

6. The method of claim 5, further comprising generating a topological graph depicting upstream and downstream relationships between the plurality of devices based on the adjacency matrix.

7. The method of claim 1, wherein the plurality of devices comprises one or more of a power meter, a circuit breaker, a contactor, an overload relay, and a drive.

8. One or more computer-readable storage media having program instructions stored thereon to identify power network topology in a factory, wherein the program instructions, when read and executed by a processing system, direct the processing system to at least:
    collect power data from a plurality of devices within a power network;
    detect a power change event in at least a first power device of the plurality of devices and a second power device of the plurality of devices;
    identify, in at least a portion of the power data associated with the power change event, a power signature of the first power device and a power signature of the second power device;
    update a probability that the first power device is connected to the second power device based on the power signature of the first power device and the power signature of the second power device; and
    generate a network topology diagram, wherein the network topology diagram reflects the probability that the first power device is connected to the second power device.

9. The one or more computer-readable storage media of claim 8, wherein the program instructions, when read and executed by the processing system, further direct the processing system to update a network topology assumption based on the updated probability that the first power device is connected to the second power device, wherein the network topology assumption includes a hierarchical relationship between the first power device and the second power device.

10. The one or more computer-readable storage media of claim 9, wherein the hierarchical relationship between the first power device and the second power device is that the first power device is downstream of the second power device.

11. The one or more computer-readable storage media of claim 8, wherein to update the probability that the first power device is connected to the second power device, the program instructions, when read and executed by the processing system, direct the processing system to update a probability that the first power device is downstream of the second power device in the power network.

12. The one or more computer-readable storage media of claim 8, wherein to update the probability that the first power device is connected to the second power device, the program instructions, when read and executed by the processing system, direct the processing system to update an adjacency matrix, wherein the adjacency matrix maps probabilities of relationships between the plurality of devices.

13. The one or more computer-readable storage media of claim 12, wherein the program instructions, when read and executed by the processing system, further direct the processing system to generate a topological graph depicting upstream and downstream relationships between the plurality of devices based on the adjacency matrix.

14. The one or more computer-readable storage media of claim 8, wherein the plurality of devices comprises one or more of a power meter, a circuit breaker, a contactor, an overload relay, and a drive.

15. A system comprising:
    one or more computer-readable storage media;
    a processing system operatively coupled with the one or more computer-readable storage media; and
    program instructions stored on the one or more computer-readable storage media for identifying power network topology, wherein the program instructions, when read and executed by the processing system, direct the processing system to at least:
        collect power data from a plurality of devices within a power network;
        detect a power change event in at least a first power device of the plurality of devices and a second power device of the plurality of devices;
        identify, in at least a portion of the power data associated with the power change event, a power signature of the first power device and a power signature of the second power device;
        update a probability that the first power device is connected to the second power device based on the power signature of the first power device and the power signature of the second power device; and generate a network topology diagram, wherein the network topology diagram reflects the probability that the first power device is connected to the second power device.

16. The system of claim 15, wherein the program instructions, when read and executed by the processing system, further direct the processing system to update a network topology assumption based on the updated probability that the first power device is connected to the second power device, wherein the network topology assumption includes a hierarchical relationship between the first power device and the second power device.

17. The system of claim 16, wherein the hierarchical relationship between the first power device and the second power device is that the first power device is downstream of the second power device.

18. The system of claim 15, wherein to update the probability that the first power device is connected to the second power device, the program instructions, when read and executed by the processing system, direct the processing system to update a probability that the first power device is downstream of the second power device in the power network.

19. The system of claim 15, wherein to update the probability that the first power device is connected to the second power device, the program instructions, when read and executed by the processing system, direct the processing system to update an adjacency matrix, wherein the adjacency matrix maps probabilities of relationships between the plurality of devices.

20. The one or more computer-readable storage media of claim 19, wherein the program instructions, when read and executed by the processing system, further direct the processing system to generate a topological graph depicting upstream and downstream relationships between the plurality of devices based on the adjacency matrix.

* * * * *